United States Patent
Evans et al.

(10) Patent No.: US 7,808,080 B2
(45) Date of Patent: Oct. 5, 2010

(54) SYNERGISTCALLY DOPED POTASSIUM NIOBATE

(75) Inventors: Dean R. Evans, Beavercreek, OH (US); Gary Cook, Beavercreek, OH (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 551 days.

(21) Appl. No.: 11/687,914

(22) Filed: Mar. 19, 2007

(65) Prior Publication Data
US 2007/0243125 A1    Oct. 18, 2007

Related U.S. Application Data

(60) Provisional application No. 60/783,694, filed on Mar. 17, 2006.

(51) Int. Cl.
*H01L 29/38*    (2006.01)
*H01L 21/00*    (2006.01)
(52) U.S. Cl. .................... 257/607; 117/2; 257/E29.105
(58) Field of Classification Search .............. 117/2; 257/607, E29.105
See application file for complete search history.

(56) References Cited

U.S. PATENT DOCUMENTS

| | | | |
|---|---|---|---|
| 3,565,577 A | 2/1971 | Nassau et al. | |
| 4,938,836 A | 7/1990 | Carenco et al. | |
| 5,034,949 A | 7/1991 | Günter | |
| 5,614,129 A | 3/1997 | Hofmeister et al. | |

OTHER PUBLICATIONS

Buse et al., "Phototrefractive properties of rethenium-doped potassium niobate", Appl. Phys. A 59, 563-567 (1994).*
M. Zgonik, C. Medrano, M. Ewart, H. Wüest, p. Günter, "$KNbO_3$ Crystals for Photorefractive Applications," *Opt. Eng.* 34, 1930 (1995).
E. Siegel, W. Urban, K. A. Mueller, E. Wiesendanger, "Electron Paramagnetic Resonance of $Fe^{3+}$ in $KNbO_3$ at 300 K," *Phys. Lett.* 53A, 415 (1975).
P. Günter and F. Micheron, "Photorefractive Effects and Photocurrents in $KNbO_3$:Fe," *Ferroelectrics* 18, 27 (1978).
R. J. Reeves, M. G. Jani, B. Jassemnejad, R. C. Powell, G. J. Mizell, and W. Fay, "Photorefractive Properties of $KNbO_3$," *Phys. Rev. B*, 43, 71 (1991).

(Continued)

*Primary Examiner*—Evan Pert
(74) *Attorney, Agent, or Firm*—AFMCLO/JAZ; Christopher J. Menke

(57) ABSTRACT

The present invention provides a photorefractive potassium niobate ($KNbO_3$) crystal including a first impurity added substitutionally to the niobium (Nb) site and a second impurity added substitutionally to the potassium (K) site, wherein the first and second impurities are different. There is also provided a method of making the codoped potassium niobate crystal ($KNbO_3$) of the present invention wherein the method includes adding at least one of the impurities to a melt composition during crystal growth, adding at least one of the impurities into an existing crystal using thermal diffusion, and/or adding at least one of impurities into an existing crystal using electrically assisted diffusion.

13 Claims, 4 Drawing Sheets

OTHER PUBLICATIONS

A. V. Postnikov, A. I. Poteryaev, and G. Borstel, "First-principles Calculations for Fe Impurities in $KNbO_3$," *Ferroelectrics* 69, 206 (1998).

F. M. Michel-Calendini, M. Peltier, and F. Micheron, "Electron Paramagnetic Resonance of $Fe^{3+}$ in Orthorhombic $KNbO_3$," *Sol. St. Commun.* 33, 145 (1980).

E. Possenriede, O. F. Schirmer, H. J. Donnerberg, and B. Hellermann, "ESR Investigation of Transition Metal Defects in $KNbO_3$," *J. Phys.: Condens. Matter* 1, 7267 (1989).

M. Ewart, R. Ryf, C. Medrano, H. Wüest, M. Zgonik, and P. Günter, "High Photorefractive Sensitivity at 860 nm in Reduced rhodium-doped $KNbO_3$," *Opt. Lett.* 22, 781(1997).

B. Zysset, I. Biaggio, P. Günter, "Refractive indices of orthorhombic $KNbO_3$. I. Dispersion and temperature dependence," *J. Opt. Soc. Am. B* 9, 380 (1992).

K.G. Deshmukh, S.G. Ingle, "Interferometric studies of domain structures in potassium niobate single crystals," *J. Phys. D* 4, 124 (1971).

* cited by examiner ial) patent page.

SYNERGISTCALLY DOPED POTASSIUM NIOBATE

CROSS REFERENCE TO RELATED APPLICATION

This application is related to, and claims priority from, U.S. Provisional Patent Application No. 60/783,694, filed on Mar. 17, 2006, by inventor Dean R. Evans et al., and entitled "Synergistically Doped Potassium Niobate." Patent Application No. 60/783,694 is hereby incorporated by reference.

RIGHTS OF THE GOVERNMENT

The invention described herein may be manufactured and used by or for the Government of the United States for all governmental purposes without the payment of any royalty.

BACKGROUND

Potassium niobate ($KNbO_3$) is a well-known electro-optic material, which when doped with impurities that act as donors and acceptors the crystal becomes photorefractive. When forming an interference pattern inside the crystal with two mutually coherent laser beams, the donor ions are photoionized and the delocalized charges are trapped by the acceptor ions in the dark regions. Through the linear Pockel's effect, the periodic space-charge field generates a periodic index of refraction, i.e., photorefractive grating. In the case where a phase shift between the periodic index of refraction and the interference pattern exists, the power from one beam couples into the other beam, this effect maximizes with a $\pi/2$ phase shift.

A key problem associated with doped $KNbO_3$ crystals is the lack of uniform photorefractive properties (i.e. non-uniform space-charge field). Several Fe-doped $KNbO_3$ crystals are available from various international growers. It has been repeatedly observed that small regions throughout the crystals, particularly near the edges, exhibit strong counter-propagating two-beam coupling (TBC) efficiencies. These regions of enhanced coupling exhibit counter-propagating TBC efficiencies, where the TBC efficiency is defined as the ratio of the instantaneous transmitted intensity to the steady-state transmitted intensity, of nearly two orders of magnitude greater than the majority of the crystal as measured at 532 nm; 1/e response times are typically several hundred microseconds when the grating is recorded using powers of a few milliwatts at f/20.

SUMMARY OF THE INVENTION

This invention relates to the general use of multiple dopants in potassium niobate such that the photorefractive properties associated with any single dopant species are enhanced significantly due to the presence of one or more further species. These enhanced characteristics are not limited to just the photorefractive effect.

Specifically, this invention relates to the addition of any impurity that replaces the potassium (K) site, for e.g. Silver (Ag), Rubidium (Rb), and Gold (Au), etc., which are added singly or in combination to potassium niobate. Furthermore, the crystal properties have been changed by applying large electrical shock, which has improved the photorefractive performance and uniformity. The dopant ingredients may be added a) to the melt composition at the time of the crystal growth, b) via thermal diffusion at an elevated temperature into an existing crystal, or c) by electrically assisted diffusion (drift) through the application of an electric current to an existing crystal using electrodes containing the dopant species. These methods can be employed in conjunction with each other in either undoped (pure) or doped (singly or co-doped) crystals; these techniques can be used in combination. Alternatively, applying large electrical impulses have been shown to change the crystal properties; this method requires time (on the order of weeks/months) for the domains to self-realign. Method c) relates to the modification of the crystal properties; methods a) and b) are related to the direct incorporation of extrinsic centers.

This invention further includes improved growth of potassium niobate. The addition of potassium substitutional impurities has been observed to 1) increase the growth rate, 2) increase the size and uniformity of the grown crystal, and 3) improve the optical quality of the finished crystals. These characteristics may impact both photorefractive and non-photorefractive applications (i.e. optical harmonic conversion) using material crystal growth techniques such as but not limited to top-seeded solution growth, Czochralski growth, Stepanov growth, solution growth, vapor transport growth, epitaxial growth by either liquid or gas phases, a ceramic composite material formulation, or by methods closely allied to these techniques.

The crystals developed in the present invention are not limited to $KNbO_3$:M, where M can be any impurity that replaces the K site in small quantities in singly or multiply doped crystals. Because of the possibility that high concentrations of the K-replacement impurities enter the host lattice, new materials (new hosts) can be grown, i.e. $M_xK_{1-x}NbO_3$ or $MKNbO_3$.

Evidence of such new host materials has been observed by the addition of new multiple facets in the as-grown crystal boules, indicating that in some cases such as when M=Au, the crystal structure may no longer be perovskite as is the case with common doped and undoped $KNbO_3$. Incorporation of large amounts of any given impurity (i.e. $M_xK_{1-x}NbO_3$, $MKNbO_3$) is useful in both photorefractive and non-photorefractive applications.

A key parameter for space-charge field (e.g. photorefractive) applications is the trap density. The materials of the present invention measure over a factor of 30 increase in trap density compared to standard $KNbO_3$:Fe (i.e. prior art crystals). Based on research and testing, this is the largest trap density of any $KNbO_3$ material. Optical and electrical measurements have been made on a new codoped potassium niobate crystal that yields a significant increase in linear absorption (broadened and enhanced), photocurrent, and photorefractive beam coupling efficiency. The Ag impurity enters the K site, changing the local field in the lattice. The Fe in the Nb site, perturbed by the replacement of the next near-neighbor K with Ag, is responsible for the enhanced linear and nonlinear properties. The modified material parameters result in an increase of the photorefractive counter-propagating two-beam coupling efficiency.

In accordance with one aspect of the present invention, there is provided a photorefractive potassium niobate ($KNbO_3$) crystal including a first impurity added substitutionally to the niobium (Nb) site and a second impurity added substitutionally to the potassium (K) site, wherein the first and second impurities are different. The impurities may be any dopant that replaces the Nb or K site. For example, the impurities may be Iron (Fe), Nickel (Ni), Silver (Ag), Rubidium (Rb), or Gold (Au). The concentration of the impurities in the crystal may be in the range of about 100 ppm to about 10,000 ppm.

In one exemplary embodiment, the first impurity is Fe and the second impurity is Ag. In another exemplary embodiment, the first impurity is Ni and the second impurity is Ag. In a further embodiment, the presence of the second impurity on the K site electronically perturbs the first impurity on the Nb site.

In a related aspect of the invention, the effective trap density ($N_A$) of the crystal is greater than trap density of singly doped equivalent crystals. In an exemplary embodiment, the trap density ($N_A$) of the crystal is in the range of about $10^{16}$ cm$^{-3}$ to about $10^{20}$ cm$^{-3}$. In a more specific embodiment, the trap density ($N_A$) of the crystal is about density may be $7.5 \times 10^{17}$ cm$^3$.

In accordance with another aspect of the present invention, there is provided a method including adding the first and second impurities to a melt composition during crystal growth. The crystal growth may be achieved by top-seeded solution growth (TSSG), Czochralski growth (CZ), Stepanov growth (SV), solution growth (SG), vapor transport growth (VT), epitaxial growth (EG) by either liquid or gas phases, a ceramic composite material formulation, or other similar techniques.

In an exemplary embodiment, the method includes thermally diffusing at least one of the first and second impurities into an existing crystal. In another embodiment, the method includes diffusing at least one of the first and second impurities into an existing crystal using an electric current passed through the crystal. The existing crystal may be a pure or singly doped crystal.

In accordance with a further aspect of the present invention, this is provided a photorefractive potassium niobate crystal (KNbO$_3$) comprising one impurity added substitutionally to the niobium (Nb) site and a second (different) impurity added substitutionally to the potassium (K) site. In exemplary embodiments, the Nb site impurity is Iron (Fe) or Silver (Ag). One or both of the impurities may occupy interstitial crystal lattice sites. In other exemplary embodiments, Fe and Ag are simultaneously present in the Nb and K sites respectively, or interstitially, or in a combination thereof.

In a related aspect, the Fe impurity is replaced with Nickel (Ni) and the Ag impurity is replaced with gold (Au) or Rubidium (Rb). In exemplary embodiments, the impurities may be replaced by any other impurities which may chemically locate within the nominal Nb and K sites, or interstitially, or in a combination thereof.

In accordance with another aspect of the invention, there is provided a co-doped KNbO$_3$ crystal wherein the Ag impurity is present with a concentration of at least 10 ppm. Alternatively, the Ag impurity is present to a maximum concentration equivalent to that of 100% substitution for the K site ions. Also, the Ag impurity may be replaced with Ru or Au.

In accordance with yet another aspect of the invention, there is provided a KNbO$_3$ crystal in which the absorption spectrum is broadened by the presence of the co-dopants described in any of the preceding claims or methods of preparation thereof. Also, there is provided a KNbO$_3$ crystal in which characteristic features of the absorption spectrum are enhanced by the presence of the co-dopants described in any of the preceding claims or methods of preparation thereof.

Finally, there is provided a method of improving the photorefractive properties of conventionally singly doped or co-doped KNbO$_3$ crystals by the application of an electrical impulse of sufficient magnitude to initially induce visible damage to the crystal structure, followed by a prolonged rest period in which the crystal is allowed to structurally recover.

BRIEF DESCRIPTION OF THE DRAWINGS

Preferred features of the present invention are disclosed in the accompanying drawings, wherein similar reference characters denote similar elements throughout the several views, and wherein.

DETAILED DESCRIPTION OF THE INVENTION

Introduction

Figure 1A:
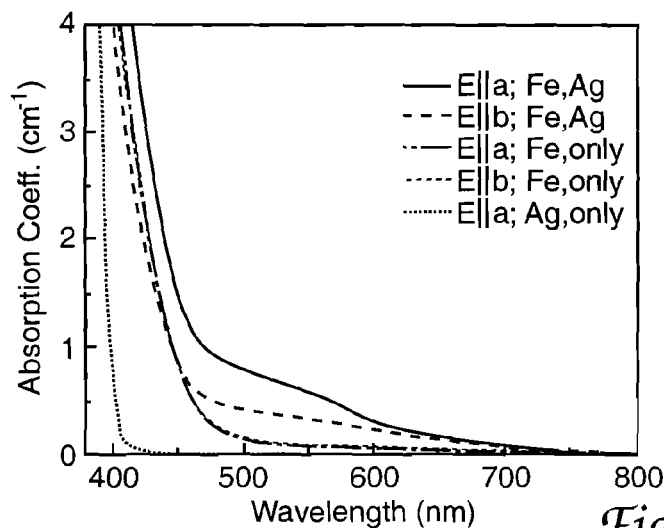
FIG. 1A is a graph representing visible absorption spectra of singly Fe doped KNbO$_3$, singly Ag doped KNbO$_3$, and Fe,Ag codoped KNbO$_3$.

In this section, differences between the optical and electrical properties in regions of strong coupling and regions of weak coupling in KNbO$_3$:Fe are investigated. The difference between these regions is due to the presence of an unintentional impurity. The contamination in the KNbO$_3$:Fe crystals was from the post-growth poling process, since the regions of contamination are concentrated along the surfaces of the crystals where electrodes are placed. To prove this, a series of codoped KNbO$_3$:Fe,Ag crystals were grown with different concentrations of Ag. In addition a singly doped KNbO$_3$:Ag crystal was also grown.

Preparation

Four doped KNbO$_3$ were grown with the top seeded solution growth technique using excess potassium oxide as a flux. Three codoped KNbO$_3$ crystals were grown with 1000 ppm Fe in the melt and codoped with different concentrations of Ag (1000, 5000, and 10,000 ppm in the melt). A fourth crystal of singly doped KNbO$_3$ was also grown with 10,000 ppm Ag added to the melt. The chemical charge was placed in an inert crucible and was allowed to soak for a few days above the melt temperature to convectively mix the liquid. The temperature was then lowered to 1-2° C. above the melting temperature and a seed, consisting of a small wedge of oriented $KNbO_3$ material, was dipped into the liquid. Seed rotation rates varied between 5 and 40 rpm during the growth process. The seed was slowly pulled upward at a rate up to 0.8 mm/h, while the temperature was ramped carefully down several degrees over a few days. Once to size, the crystal was quickly lifted above the liquid melt. Cooling was complicated by two solid phase changes. The material is cubic at growth and becomes tetragonal at 435° C. and then orthorhombic below 225° C. The internal stresses from these changes create multiple domains and twins in the crystal; therefore, poling is required to change the final product into a single domain crystal. Fabrication of the as-grown doped $KNbO_3$ crystals required determination of the crystal axes. The crystal was oriented by visually finding the "B" facet and then cutting into the largest ABC-block possible. The "A" and "C" faces were found through X-ray orientation.

The standard method of poling a potassium niobate crystal is to apply an electrical field along the c-axis at an elevate temperature, but less than the phase transition temperature. Poling was achieved when the crystal became single domain (clear) through the "B" face. To assure a good ohmic contact during poling, a conductive coating is often used on the z-surfaces, e.g., Ag paint. Even at temperatures ≦200° C., diffusion of Ag (with relatively small depths) is possible since it is assisted by an E-field on the order of 1000 V/cm. The three codoped samples grown for this invention have been poled without using conductive paint on the z-surfaces in order to reduce the possibility of any unintentional post-growth contamination. The singly doped $KNbO_3$:Ag was poled using a conductive Ag paint. In over a dozen samples of singly doped $KNbO_3$:Fe that were grown and poled without the use of conductive paints, regions of enhanced absorption and TBC have never been observed. For the crystals poled without use of conductive paints, weighted free standing (non-silver) electrodes were used.

Results

In both the unintentionally and intentionally codoped materials, regions of strong TBC have an enhanced linear absorption in the visible and near-infrared (near-IR) spectral regions resulting in a slightly darker appearance by eye. The intentionally codoped $KNbO_3$:Fe,Ag crystals vary in the total fractional volume of darker regions in each crystal, corresponding to the total amount of Ag in the melt. The fractional volume of darker regions increases with greater concentrations of Ag; although the lowest concentration codoped crystal, 1000 ppm Ag, did not exhibit any noticeably darker regions. Because the same spectral differences occur in both the intentionally and unintentionally codoped crystals, and the same type of darker regions found at the edges of the unintentionally codoped crystal are distributed throughout the crystal volume in the 5,000 and 10,000 ppm Ag (intentionally) codoped crystals, the fact that Ag electrodes can diffuse into singly doped $KNbO_3$:Fe during poling is reasonable.

FIG. 1A shows the absorption spectra of the $KNbO_3$:Fe and $KNbO_3$:Fe,Ag. The absorption at 532 nm increases from 0.067 $cm^{-1}$ (Fe) to 0.947 $cm^{-1}$ (Fe,Ag) because of the presence of Ag, although Ag itself in singly doped $KNbO_3$:Ag does not have any significant absorption in the visible (0.003 $cm^{-1}$ at 532 nm). When comparing the absorption of the perturbed Fe (Fe influenced by Ag) with the unperturbed Fe (Fe influenced by K), the absorption coefficients are significantly greater over the visible spectral region extending further into the near-infrared. The enhanced absorption is also significant when compared with published results in which a greater concentration of Fe was used and post-growth reduction further increased the $Fe^{2+}$ (visible) absorption. The fact that the Ag ions do not directly contribute to the linear absorption is proof that it is the influence of the Ag on the Fe (perturbed Fe) that enhances the linear absorption and not the Ag ions alone.

Figure 1B:
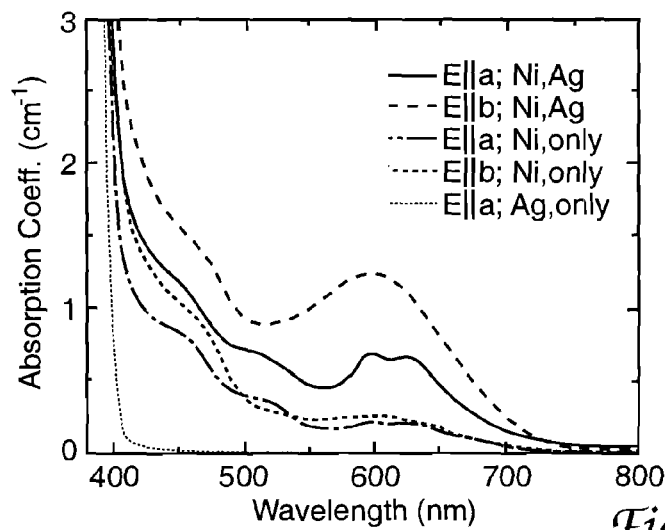
FIG. 1B is a graph representing visible absorption spectra of singly Ni doped KNbO$_3$, singly Ag doped KNbO$_3$, and Ni,Ag codoped KNbO$_3$.
Figure 1C:
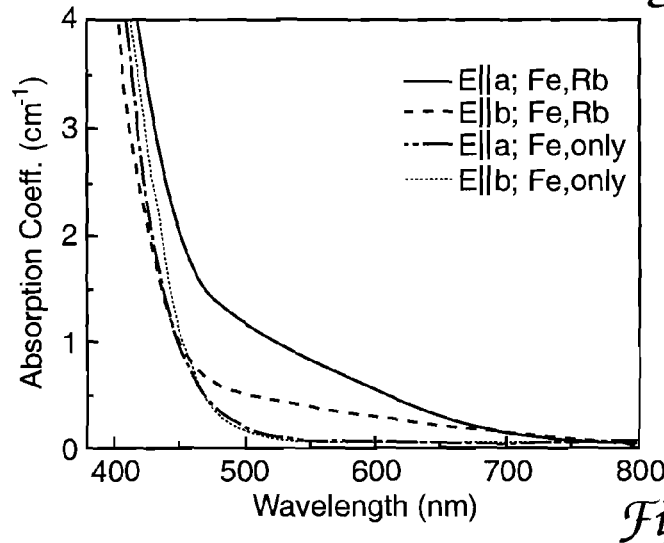
FIG. 1C is a graph representing visible absorption spectra of singly Fe doped KNbO$_3$ and Fe,Rb codoped KNbO$_3$.

FIGS. 1B and 1C further show absorption spectra of doped and codoped $KNbO_3$. FIG. 1B is visible absorption spectra of singly Ni doped $KNbO_3$, singly Ag doped $KNbO_3$, and Ni,Ag codoped $KNbO_3$. FIG. 1C is visible absorption spectra of singly Fe doped $KNbO_3$ and Fe,Rb codoped $KNbO_3$.

Figure 2:
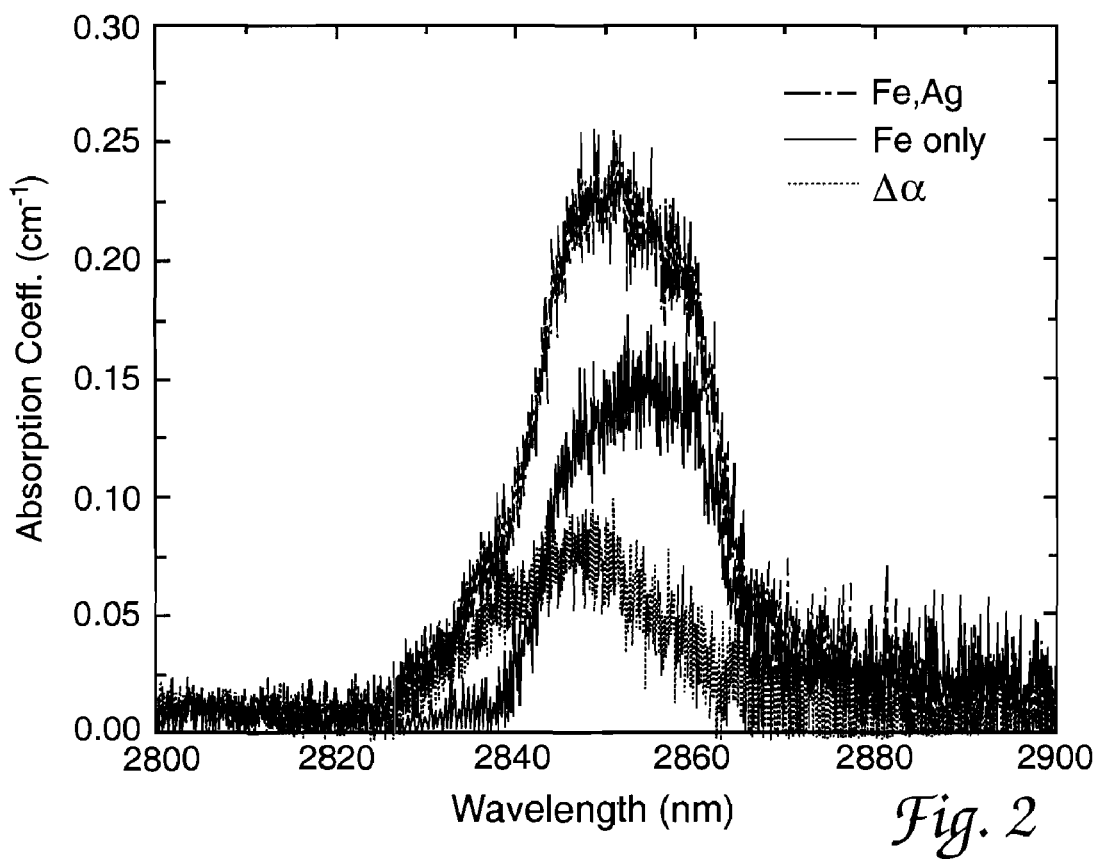
FIG. 2 represents OH$^-$ absorption spectra of singly Fe doped and Fe,Ag codoped KNbO$_3$ in which the difference of the dashed band and solid bands indicates the new OH$^-$ band (dotted) that forms in the presence of Ag.

A similar effect is seen in the IR, where the absorption of the $OH^-$ molecules is perturbed by the Ag ions, as seen in FIG. 2. The hydrogen positions predominantly along the O—O directions of the oxygen octahedron. The $OH^-$ absorption in the presence of Ag (strong TBC region) is broader and blue shift from the $OH^-$ absorption found in the presence of K (weak TBC region).

Note the absorption coefficient for the singly doped $KNbO_3$:Ag crystal is <0.003 $cm^{-1}$ at 532 nm, and has a fairly flat response throughout the visible and near-IR spectral regions. Also, when comparing the absorption of the perturbed Fe (Fe influenced by Ag) to the unperturbed Fe (Fe influenced K), the absorption coefficient is significantly greater over the visible spectral region and extends further into the near-IR. The observed enhanced absorption is also significant when comparing it to published results where an order of magnitude greater concentration of Fe is used and the crystal is annealed in a reducing atmosphere to increase the Fe2+ (visible) absorption.

It is understood that photorefractive centers (e.g., Fe) in $KNbO_3$ go in substitutionally for the Nb site ($Fe_{Nb}$—Fe in a Nb site) and this may be achieved with or without charge compensating defects. It is unlikely that Fe ions would enter the K site because of the relatively large difference in ionic radii. The Fe ions, where the ionic radii of $Fe^{2+}$ (donor) and $Fe^{3+}$ (acceptor) are 0.74 and 0.64 Å, respectively, are too small to replace the larger K+ ion (1.33 Å). Because of the similarities in the size and charge of $Ag^+$ (1.26 Å, +1) it is most likely to enter the $K^+$ site ($Ag_K$—Ag in a K site), changing the local field in the lattice and in turn perturbing the $Fe_{Nb}$ (next near neighbor) causing a change in the linear absorption (as described above and in FIG. 1).

Referring again to FIG. 2, the full-width at half-maximum (FWHM) values are 23.3 and 20.6 nm, respectively. These bands are centered about 2846 nm and between 2848 and 2858 nm for the $OH^-$ near a Ag and $OH^-$ near a K, respectively. Subtracting the $OH^-$ absorption bands as measured on the regions of strong and weak coupling, one can see the new absorption band solely due to the presence of Ag.

Figure 3:
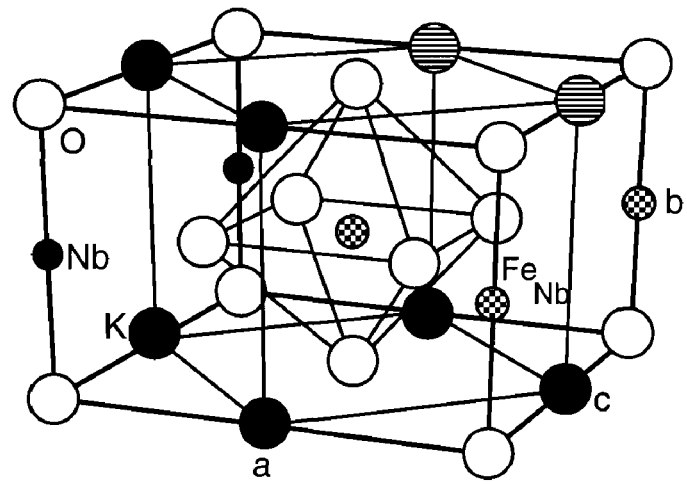
FIG. 3 illustrates Fe and Ag sites in the KNbO$_3$ lattice in which the ions are depicted by: (large filled circles) K ions, (large open circles) O ions, (small filled circles) Nb ions, (small checkered circles) Fe ions, and (large striped circles) Ag ions.

The position of the K and Ag ions with respect to the other ions making up the host lattice can be seen in FIG. 3. The lattice structure of $KNbO_3$ is shown with the substitutionally replaced K and Nb ions. The lattice structure is composed of a cubic cell consisting of niobium, potassium, and oxygen ions surrounding an oxygen octahedral with a niobium ion in the center. Unlike common dopants in $KNbO_3$ crystals where the K sites ($K_K$) remain unaffected by the incorporation of impurities, Ag ions replace K ions ($Ag_K$) and play a significant role in the pertubation of the main photorefractive donor site ($Fe_{Nb}$). Coordination number, charge, and ionic radius are important parameters in considering what impurities can enter the K-site; the synergistic effect is not limited to Ag (see FIG. 3/Table 1 for examples).

TABLE 1

| Coord. # | Chg. | Ion. Rad. | Site |
|---|---|---|---|
| 8 | +1 | 1.51 Å | $K_K$ |
| 8 | +1 | 1.28 Å | $Ag_K$ |
| 8 | +1 | 1.61 Å | $Rb_K$ |
| 6 | +1 | 1.37 Å | $Au_K$ |

Figure 4:
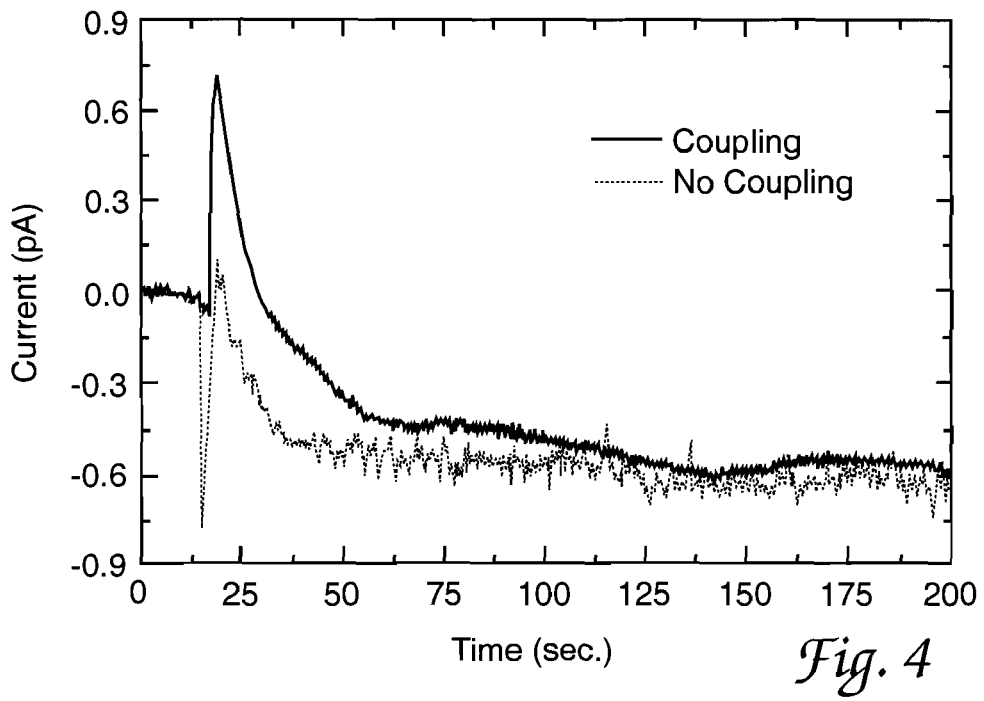
FIG. 4 is a graph of pyroelectric and photovoltaic currents (transient and steady-state) in the regions of strong coupling/perturbed Fe (dotted line) and no-coupling/unperturbed Fe (solid line)

The linear absorption plays a role in the enhancement of the photorefractive and photovoltaic effects, but it does not account for the significant improvements observed in $KNbO_3$:Fe,Ag. In the prior art, $KNbO_3$:Fe has a relatively large absorption coefficient (4.7 cm$^{-1}$ at 488 nm), yet the photovoltaic field is weak (145 V/cm). Instead of the increased absorption being the key parameter in the enhancement of the photovoltaic effect in $KNbO_3$:Fe,Ag, it is rather that it is due to the perturbed $Fe_{Nb}$. The transient and steady-state response of the current associated with the photovoltaic effect are generated using 514 nm laser light, FIG. 4. The steady-state photocurrents are approximately the same for regions of strong and weak-coupling, but there is a strong difference in the transient case. In the region of weak-coupling the main feature observed in the transient regime is the pyroelectric current (sharp rise with a subsequent gradual reduction as the crystal reaches a thermal equilibrium); a weakly opposing photocurrent is also present. In the region of strong coupling, the large pyroelectric current signal is strongly opposed by a sharp rise (negative direction) in the transient photocurrent. The photovoltaic fields associated with the photocurrents, measured by applying a field to counteract the photocurrent, yield values of 305 and 1065 V/cm for the steady-state and transient currents, respectively. The steady-state photovoltaic field value is over a factor of two greater compared to the published value in the prior art, even though the absorption in the material of the present invention is considerably less.

Enhancement of photovoltaic field is known to increase the space-charge field, which strongly assists the formation of the grating required for TBC. Without a significant contribution from the photovoltaic field, the space-charge field is predominantly diffusion driven as is the case of $KNbO_3$:Fe. In $KNbO_3$:Fe,Ag photocurrent associated with the photovoltaic effect is a contributing term in the formation of the space-charge field, although theory suggests that a significantly larger field would be required to have such an enhancing effect the formation of the space-charge field. It is interesting to note that both perturbed and unperturbed Fe in $KNbO_3$ yield similar steady-state photovoltaic currents (0.6 pA corresponding to ~300 V/cm), but the transient current appears to be the major driving term in the perturbed Fe case. In addition to the photovoltaic current measurements, photovoltaic noise is observed in the TBC measurements on regions of strong TBC (areas of perturbed Fe). This shows that the affect of the photovoltaic field is significantly greater than that of the weak coupling areas (unperturbed Fe).

Figure 5:
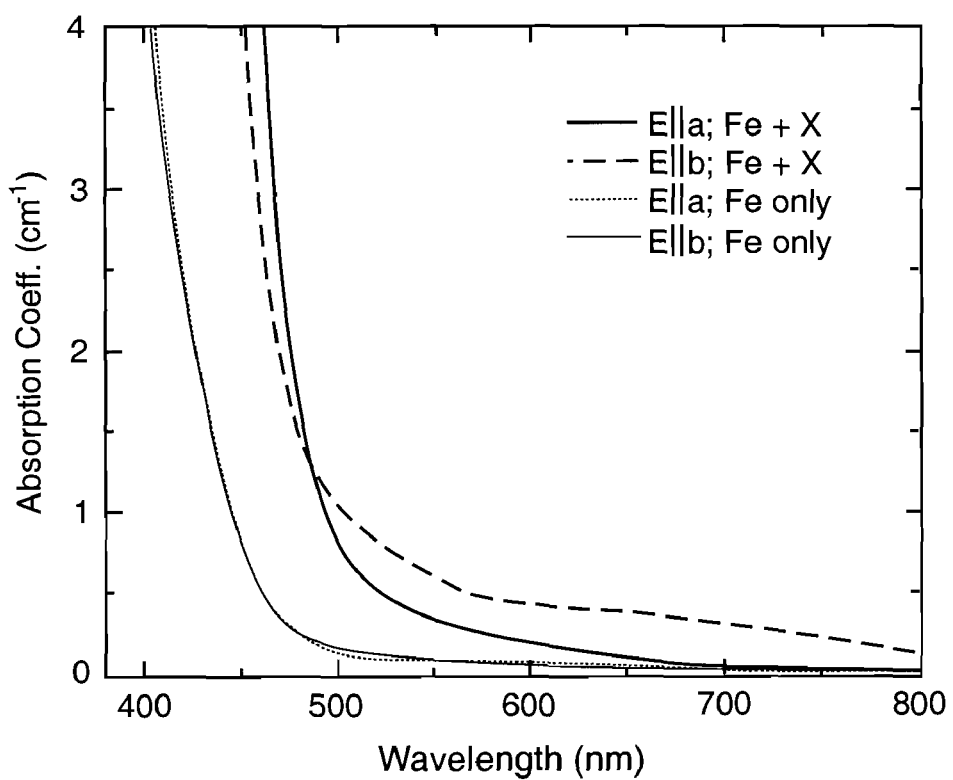
FIG. 5 is a graph showing visible/near-infrared absorption spectra of doped KNbO$_3$: unperturbed Fe (singly doped) and perturbed Fe by the presence of an unknown intrinsic changes (denoted as X; KNbO$_3$:Fe,X) induced by electrical impulses.

In addition to intentionally doped (extrinsic) impurities (e.g. Ag, etc.), the intrinsic properties have changed as a results of an electric shock which have improved the performance of the crystal as well as significantly improved the uniformity of the photorefractive effect throughout the crystal. The absorption spectra in FIG. 5 show a similar effect of the enhanced/broadened absorption, which extends even further into the near-infrared (NIR) region than the Ag or Rb codoped crystals.

In the present invention, the dopant ingredients may be added: 1) to the melt composition at the time of the crystal growth, 2) via thermal diffusion at an elevated temperature into an existing crystal, or 3) by electrically assisted diffusion through the application of an electric current to an existing crystal using electrodes containing the dopant species. The existing crystal into which the intended dopants/codopants (entering into various sites, e.g. Nb, K, etc.) are to be diffused may be doped or undoped. The electrically assisted diffusion may be carried out as part of the poling (domain alignment) process or as a separate process. Furthermore, evidence of intrinsic modifications has been observed when treated the crystal with electrical impulses and allowing for the domains to self-realign over a periods of time (on the order of weeks/months).

Figure 6:
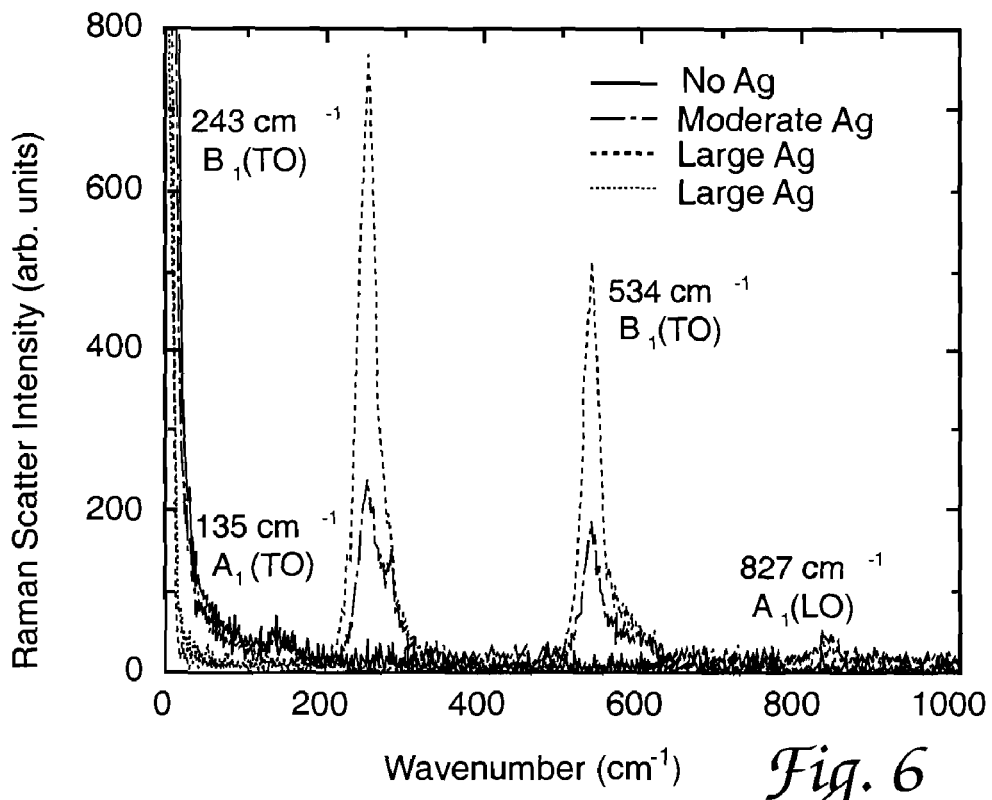
FIG. 6 is a graph showing Raman spectra of Fe doped and Fe,Ag KNbO$_3$ in which various concentration of Ag are denoted by No Ag, Moderate Ag, and Large Ag.

The addition of potassium substitutional impurities demonstrates an increase in the growth rate, an increase in the size and uniformity of the grown crystal, an improve in the optical quality of the finished crystals, and an increase in the trap density. The present invention may therefore also be used for non-photorefractive applications (such as optical harmonic conversion), where improved optical quality and physical size may be beneficial. Furthermore, because of the high concentrations of the K-replacement impurities that have been used, new materials are being developed such as $M_xK_{1-x}NbO_3$, where M can be any impurity that replaces the K site. Evidence of such new materials has been observed by the addition of new multiple facets in the as-grown crystal boules, indicating that in some cases, such as when M=Au the crystal structure may no longer be perovskite as is the case with common doped and undoped $KNbO_3$. Additional evidence suggestion a structural change is that the Raman signature has changed significantly for synergistically doped materials with respect to singly doped crystals (i.e. $KNbO_3$:Fe,Ag vs. $KNbO_3$:Fe). FIG. 6 shows that the phonon modes associated with the Raman spectrum are dramatically affected by synergistically dopants, showing that the new crystals are not only different optically but the vibrational modes are changed as well. Incorporation of large amounts of any given crystal, denoted as "M" above, will change the material from being $KNbO_3$:M to $MKNbO_3$, which is a new host material that can be used in both photorefractive and non-photorefractive applications.

Moreover, the TBC efficiency is strongly dependent on the trap density. The TBC efficiency can be sensitive to the magnitude of the photovoltaic field, but the photovoltaic effect is apparent only when the photovoltaic field becomes significant compared with the saturation field (the maximum possible field). The saturation field depends linearly on the trap density.

Figure 7:
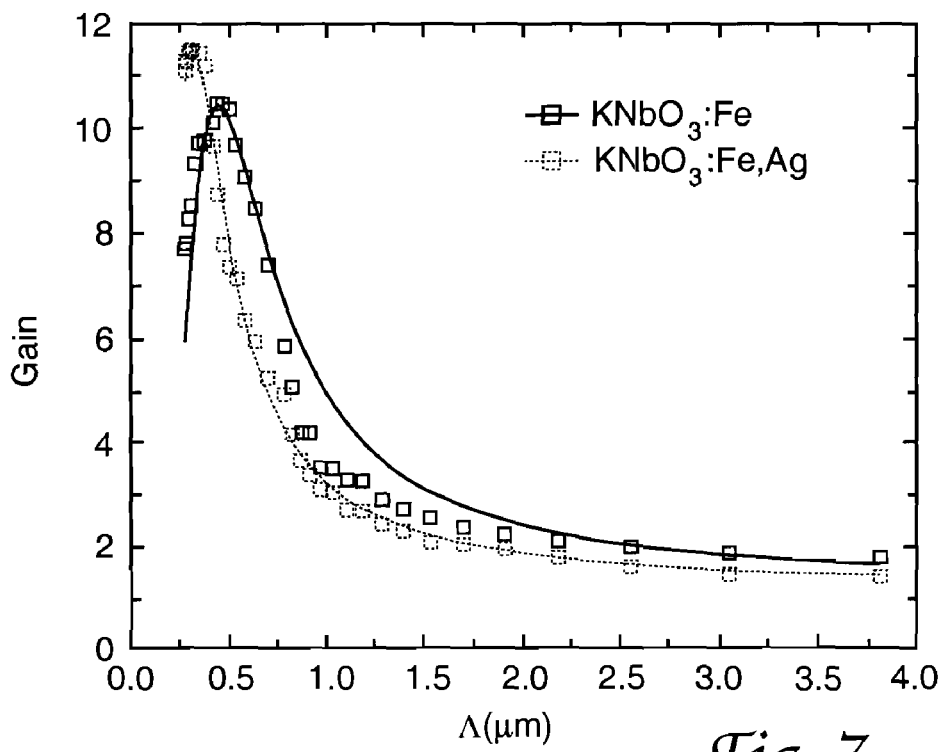
FIG. 7 illustrates the photorefractive gain as a function of grating space for singly Fe doped KNbO$_3$ and Fe,Ag codoped KNbO$_3$.

One of the most significant parameter changes in synergistically dopant $KNbO_3$ is the trap density. The materials of the present invention measure over a factor of 30 increase in trap density compared to standard $KNbO_3$:Fe (i.e. crystals not treated by our inventive process). To our knowledge, this is the largest trap density of any $KNbO_3$ material. The trap density was determined by measuring the photorefractive gain as a function of grating space, FIG. 7, this gives the Debye screening length and in turn the trap density. Table 2 lists the trap density ($N_A$) and gain coefficients for Fe doped and Fe,Ag and Fe,X synergistically doped materials.

TABLE 2

| | $KNbO_3$: Fe | $KNbO_3$: Fe, X | $KNbO_3$: Fe, Ag |
|---|---|---|---|
| Gain Coeff: | 16 cm$^{-1}$ | 20 cm$^{-1}$ | 24 cm$^{-1}$ |
| $N_A$: | $2.5 \times 10^{16}$ cm$^{-3}$ | $5 \times 10^{16}$ cm$^{-3}$ | $7.5 \times 10^{17}$ cm$^{-3}$ |

In addition to the significant trap density increase of $KNbO_3$:Fe,Ag with respect to $KNbO_3$:Fe, the gain coefficient has dramatically increased, and the sign of the charge carrier has switched from hole conductivity (+) to electron conductivity (−), which has also reduced the response time from 10's of milliseconds to 10's of microseconds. The values listed in Table 2 are based on counter-propagating beams along the c-axis. Off-axis counter-propagating two-beam coupling yields values >40 cm$^{-1}$.

In sum, unlike common dopants in $KNbO_3$ crystals where the K sites ($K_K$) remain unaffected by the incorporation of impurities, Ag ions replace K ions ($Ag_K$) and play a significant role in the perturbation of the main photorefractive donor site ($Fe_{Nb}$). The visible absorption and the IR absorption of the OH$^-$ are also strongly influenced by the presence of Ag, which increases the sensitivity and extends the spectral range. In addition, the perturbation of the donor ions ($Fe_{Nb}$) enhances the photovoltaic effect. It is likely that the incorporation of Ag also increases the trap density. Through these modifications of the crystal parameters, the overall performance of photorefractive counter-propagating TBC is enhanced.

Several non-patent documents, authored by the inventors of the present application, provide additional disclosure of synergistically doped potassium niobate. These documents include: "Major Improvements of the Photorefractive and Photovoltaic Properties in Potassium Niobate," *Optics Letters*, 31, 89 (2006); "Understanding the Optical and Electrical Properties of a New Photorefractive Potassium Niobate Crystal," *Journal of Luminescence*, 119-120, 535 (2006); "Anisotropy of Nonlinear Coupling of Two Counter-Propagating Waves in Photorefractive Fe:$KNbO_3$," *Physical Review B*, 17, 174102 (2006); and "Research Continues to Advance Photorefractive Beam Coupling," Laser Focus World, 67-70, December (2005). The above-mentioned documents are hereby incorporated by reference.

While various descriptions of the present invention are described above, it should be understood that the various features can be used singly or in any combination thereof. Therefore, this invention is not to be limited to only the specifically preferred embodiments depicted herein. Further, it should be understood that variations and modifications within the spirit and scope of the invention may occur to those skilled in the art to which the invention pertains. Accordingly, all expedient modifications readily attainable by one versed in the art from the disclosure set forth herein that are within the scope and spirit of the present invention are to be included as further embodiments of the present invention. The scope of the present invention is accordingly defined as set forth in the appended claims.

What is claimed is:

1. A photorefractive potassium niobate ($KNbO_3$) crystal comprising a first impurity added substitutionally to a niobium (Nb) site and a second impurity added substitutionally to a neighboring potassium (K) site, wherein the first and second impurities are different and wherein the first impurity is Iron (Fe).

2. A photorefractive potassium niobate ($KNbO_3$) crystal comprising a first impurity added substitutionally to a niobium (Nb) site and a second impurity added substitutionally to a neighboring potassium (K) site, wherein the first and second impurities are different and wherein to second impurity is Silver (Ag).

3. The $KNbO_3$ crystal of claim 2 wherein the second impurity (Ag) has a concentration in the range of about 100 ppm to about 10,000 ppm.

4. The $KNbO_3$ crystal of claim 2 wherein the first impurity is Fe.

5. A photorefractive potassium niobate ($KNbO_3$) crystal comprising a first impurity added substitutionally to a niobium (Nb) site and a second impurity added substitutionally to a neighboring potassium (K) site, wherein the first and second impurities are different and wherein the first impurity is Nickel (Ni).

6. The $KNbO_3$ crystal of claim 5 wherein the second impurity is Ag.

7. A photorefractive potassium niobate ($KNbO_3$) crystal comprising a first impurity added substitutionally to a niobium (Nb) site and a second impurity added substitutionally to a neighboring potassium (K) site, wherein the first and second impurities are different and wherein the second impurity is Rubidium (Rb).

8. A photorefractive potassium niobate ($KNbO_3$) crystal comprising a first impurity added substitutionally to a niobium (Nb) site and a second impurity added substitutionally to a neighboring potassium (K) site, wherein the first and second impurities are different and wherein the second impurity is Gold (Au).

9. A method of making the $KNbO_3$ crystal of claim 1, the method comprising thermally diffusing at least one of the first and second impurities into an existing crystal.

10. The method of making the $KNbO_3$ crystal of claim 9, wherein the existing crystal is a pure or singly doped crystal.

11. The method of making the $KNbO_3$ crystal of claim 9, the method comprising thermally diffusing the first and second impurities into an existing crystal.

12. A method of making the $KNbO_3$ crystal of claim 1, the method comprising diffusing at least one of the first and second impurities into an existing crystal using an electric current passed through the crystal.

13. The method of making the $KNbO_3$ crystal of claim 12, wherein the existing crystal is a pure or singly doped crystal.

* * * * *